US010886699B1

(12) United States Patent
Chin et al.

(10) Patent No.: US 10,886,699 B1
(45) Date of Patent: Jan. 5, 2021

(54) METHODS AND SYSTEMS FOR REDUCING SIZE WEIGHT AND POWER (SWAP) IN HIGH ENERGY LASER SYSTEMS

(71) Applicant: Science Research Laboratory, Inc., Somerville, MA (US)

(72) Inventors: Aland K. Chin, Sharon, MA (US); Richard H. Chin, Somerville, MA (US); Mehmet Dogan, Somerville, MA (US); Jonah H. Jacob, Somerville, MA (US)

(73) Assignee: Science Research Laboratories, Inc., Somerville, MA (US)

( * ) Notice: Subject to any disclaimer, the term of this patent is extended or adjusted under 35 U.S.C. 154(b) by 0 days.

(21) Appl. No.: 16/425,215

(22) Filed: May 29, 2019

Related U.S. Application Data

(63) Continuation-in-part of application No. 16/397,269, filed on Apr. 29, 2019.

(60) Provisional application No. 62/679,247, filed on Jun. 1, 2018, provisional application No. 62/665,212, filed on May 1, 2018.

(51) Int. Cl.
| *H01S 5/068* | (2006.01) |
| *H01S 5/0683* | (2006.01) |
| *H01S 5/042* | (2006.01) |
| *H05K 1/02* | (2006.01) |
| *H05K 1/18* | (2006.01) |
| *H05K 7/20* | (2006.01) |

(52) U.S. Cl.
CPC .......... *H01S 5/06804* (2013.01); *H01S 5/042* (2013.01); *H01S 5/0683* (2013.01); *H05K 1/0204* (2013.01); *H05K 1/181* (2013.01); *H05K 7/20509* (2013.01); *H05K 2201/066* (2013.01)

(58) Field of Classification Search
CPC .... H01S 5/06804; H01S 5/042; H01S 5/0683; H01S 5/02423; H01S 5/02476; H01S 5/02492; H01S 5/067; H01S 5/041; H05K 1/0204; H05K 1/181; H05K 7/20509; H05K 2201/066
See application file for complete search history.

(56) References Cited

U.S. PATENT DOCUMENTS

| 5,708,566 | A | 1/1998 | Hunninghaus et al. |
| 5,768,104 | A | 6/1998 | Salmonson et al. |
| 6,061,240 | A | 5/2000 | Butterbaugh et al. |
| 6,661,659 | B2 | 12/2003 | Tamba et al. |
| 6,697,402 | B2 | 2/2004 | Crawford |
| 7,230,334 | B2 | 6/2007 | Andry et al. |
| 8,107,075 | B2 | 1/2012 | Otani et al. |
| 8,305,252 | B2 | 11/2012 | Bradley |
| 9,008,137 | B1 | 4/2015 | Plummer et al. |
| 9,877,408 | B2 | 1/2018 | Tan et al. |

(Continued)

OTHER PUBLICATIONS

R. E. Hendron, C. C. Becker, J. L. Levy, and J. E. Jackson, "Stackable wafer thin coolers for high power laser diode arrays", Proc. of the SPIE, vol. 1219, 330-340 (1990).

(Continued)

*Primary Examiner* — Armando Rodriguez
(74) *Attorney, Agent, or Firm* — Culhane Meadows PLLC; Orlando Lopez (57) ABSTRACT

Methods and systems for reducing SWaP in combinations of laser diode drivers (LDDs) and diode laser pump modules (DPMs) are disclosed.

8 Claims, 5 Drawing Sheets

(56) References Cited

U.S. PATENT DOCUMENTS 9,879,926 B2 1/2018 David et al.
2006/0067373 A1* 3/2006 Alander .............. H01S 5/4031
372/34

OTHER PUBLICATIONS

V. Krause, H.-G. Treusch, P. Loosen, T. Kimpel, J. Biesenbach, A. Kösters, F. Robert, H. Oestreicher, M. Marchiano, and B. DeOdorico, "Microchannel coolers for high power laser diodes in copper technology", Proc. of the SPIE, vol. 2148, 351-358 (1994).
Microsystems Technology Office, Broad Area Announcement, "Efficient Ultra-Compact Laser Integrated Devices (EUCLID)", HR001117S0013, Dec. 19 2016.

* cited by examiner

METHODS AND SYSTEMS FOR REDUCING SIZE WEIGHT AND POWER (SWAP) IN HIGH ENERGY LASER SYSTEMS

CROSS REFERENCE TO RELATED APPLICATIONS

This application is a continuation in part of U.S. patent application Ser. No. 16/397,269, entitled SYSTEMS AND METHODS FOR REMOVING WASTE HEAT FROM COMPONENTS ATTACHED TO A SURFACE OF A PRINTED CIRCUIT BOARD, filed on Apr. 29, 2019, which claims priority of U.S. provisional application 62/665,212, entitled SYSTEMS AND METHODS FOR REMOVING WASTE HEAT FROM COMPONENTS ATTACHED TO A SURFACE OF A PRINTED CIRCUIT BOARD, filed on May 1, 2018, and this application also claims priority of U.S. provisional application No. 62/679,247, entitled METHODS AND SYSTEMS FOR REDUCING SIZE WEIGHT AND POWER (SWaP) IN HIGH ENERGY LASER SYSTEMS, filed on Jun. 1, 2018, all of which are incorporated by reference herein in their entirety and for all purposes.

BACKGROUND

The present teachings relate generally to reduction of SWaP in high-energy laser (HEL)) systems and, more particularly, to reduction in HEL system SWaP by the integration of a low SWaP, microchannel cooled, laser diode driver (LDD) and a low SWaP, microchannel cooled, diode laser pump module (DPM).

"High energy laser {HEL} technology is of interest to the Military Services for its potential to provide new and enhanced capabilities such as silent engagement, deep magazine, scalable effects, and reduced logistics burdens. Until recently, these systems have been too large and heavy to be widely deployed on military platforms.

Fiber laser arrays are a leading candidate technology for integration into mission capable platforms." "Recent efforts to reduce the size and weight of fiber amplifiers and related HEL technology have shown promise and can enable important applications on larger platforms such as the AF AC-130 gunship or Army HEMMIT (ground vehicle). However, further size, weight and power (SWAP) reduction of these systems is required to increase laser power on larger platforms and enable missions on smaller platforms."

"The diode laser pump modules (DPMs) {and associated electrical power system} which power the fiber laser amplifiers are presently a significant driver of system level SWaP." There is a need for DPMs with coolant and coolant systems consistent with operation on fighter aircraft.

In previous disclosures, the LDD and the DPM are separate components referred to as "voltage regulator" and "laser pump system", respectively. A LDD in this disclosure is defined as an electronic subsystem that provides a desired output direct current (DC) with sufficient compliance voltage to operate the DPM. The input to the LDD is preferably a battery with voltage exceeding the compliance voltage required to operate the DPM and the charge capacity to supply the desired output current of the LDD for a period of time exceeding several minutes. The spatial location of the LDD relative to the spatial location of the DPM is not discussed by T. Bradley in U.S. Pat. No. 8,305,252.

The cooling of the LDD and the DPM are generally not discussed. In one previously disclosed embodiment, the fiber laser is a 3 kW commercial fiber laser from IPG Photonics. In commercial lasers, the cooling system for DPMs is a water cooled cold plate, e.g. tube cold plates available from Lytron. Cooling systems for DPMs involving a cold plate are selected for commercial use due to low cost but are not low SWaP. In commercial lasers, the cooling system for LDDs is generally an air cooled heat-fin. Cooling systems involving an air cooled heat-fin are selected for commercial use due to low cost but are not low SWaP. Additionally, for deployment of the HEL system in certain aircraft, air for cooling is sometimes unavailable and coolant in sufficient quantity is sometimes unavailable.

There is a need for methods and systems for reducing SWaP in combinations of laser diode drivers (LDDs) and diode laser pump modules (DPMs).

BRIEF SUMMARY

Methods and systems for reducing SWaP in combinations of laser diode drivers (LDDs) and diode laser pump modules (DPMs) are disclosed hereinbelow.

In one or more embodiments, the system of these teachings includes a printed circuit board having components of a laser diode driver circuit, the components comprising a plurality of high-powered electronic components, surface mounted onto one surface of the printed circuit board, each one of the plurality of high-powered electronic components overlying one surface of a thermal via extending from the one surface of the printed circuit board to an opposing surface of the printed circuit board, the laser diode driver circuit having electrical connections configured to provide driving current for laser diodes, a plurality of plates of electrically insulating and high thermal conductivity material, each one of the plurality of plates being of a predetermined thickness, each one of the plurality of plates being disposed and sized to cover an opposing surface of the thermal via located under each one of the plurality of high-powered electronic components, each one of the plurality of plates being operatively attached to the opposing surface of the printed circuit board by use of thermally conductive adhesive, a heat spreader plate of high thermal conductivity material operatively attached to the plurality of plates by use of the thermally conductive adhesive, an area of the heat spreader plate at least covering an area of the printed circuit board on which the plurality of high-powered electronic components are mounted, and a heat removal component using liquid coolant, the heat removal component being operatively attached to the heat spreader plate by use of one of the electrically conductive adhesive and solder, the heat removal component having a coolant inlet for the heat removal component and a coolant outlet for the heat removal component.

In one instance, the system of these teachings also includes a diode laser pump module including one or more laser diode optical sources; a laser diode optical source being one of a laser diode or a laser diode bar, one or more temperature control components, each one of the one or more temperature control components being attached to one of the one or more laser diode optical sources, an optical system configured to optically couple electromagnetic radiation emitted from the one or more laser diode optical sources into an optical fiber, and a distribution structure having a coolant inlet for the diode laser pump module and a coolant outlet for the diode laser pump module and configured to distribute coolant to the one or more temperature control components, the one or more laser diode optical sources are electrically operatively connected to each other in one of a series or parallel connection and are electrically connected to an anode connection for the diode laser pump module and a cathode connection for the diode laser pump module. In that instance, the system of these teachings also includes a coolant conduit operatively connecting the coolant outlet for the diode laser pump module through the coolant inlet for data heat removal component. The electrical connections of the laser diode driver are electrically operatively connected to the anode and cathode connections for the diode laser pump module.

In one or more embodiments, the method of these teachings for reducing system size, weight and power of a high energy fiber laser includes using a liquid coolant heat removal component for cooling a laser diode driver and using other liquid coolant heat removal components for cooling a diode laser pump module, spatially locating the laser diode driver and the diode laser pump module at a shortest distance consistent with an integrated design, and operatively connecting a coolant outlet channel from the diode laser pump module to a coolant inlet channel for the laser diode driver, electrical connections of the laser diode driver being electrically operatively connected to anode and cathode connections for the diode laser pump module.

For a better understanding of the present teachings, together with other further objects thereof, reference is made to the accompanying drawings and detailed description and its scope will be pointed out in the appended claims.

BRIEF DESCRIPTION OF THE DRAWINGS

FIGS. 1A1 and 1A2 show top and bottom views of a microchannel cooled laser diode driver;

DETAILED DESCRIPTION

The description is not to be taken in a limiting sense, but is made merely for the purpose of illustrating the general principles of these teachings, since the scope of these teachings is best defined by the appended claims.

The above illustrative and further embodiments are described below in conjunction with the following drawings, where specifically numbered components are described and will be appreciated to be thus described in all figures of the disclosure:

As used herein, the singular forms "a," "an," and "the" include the plural reference unless the context clearly dictates otherwise.

In general, high power electronic systems such as LDDs or high power opto-electronic systems such as DPMs require cooling to improve device performance (efficiency) or to improve device lifetime. However, the spatial distribution of temperature is not uniform. The heat is generated in localized regions. For LDDs, the majority of the waste heat is generated by the inductors and the semiconductor switches, e.g. FETs. For DPMs, the majority of the waste heat is generated by the laser diode. Heat sinks with liquid coolant, such as Microchannel coolers, contain a large heat transfer surface area in a very small package. The use of heat sinks with liquid coolant to cool LDDs and DPMs reduces SWaP because a heat sink with liquid coolant, for example, a MCC:

1. cools the localized regions where the majority of the heat is generated.
2. has a lower thermal resistance relative to cold plates and heat-fins leading to lower component temperatures.

Integration of the two components (LDD and DPM) in this document is defined as:

1. Assuming each component is enclosed in the smallest rectilinear enclosure, the two components are spatially-located at the shortest distance practical for the integrated design.
2. The outlet coolant channel from the DPM is directly connected to the inlet coolant channel of the LDD. The connection is as short as practical for the integrated design. In the ideal case, the LDD and DPM share a common coolant distribution platform.
3. The anode and cathode of the LDD is directly connected to the corresponding anode and cathode of the DPM. The connections are as short as practical for the integrated design.

Integrating the LDD and DPM clearly reduces size and weight relative to the individual subsystems by eliminating/minimizing the coolant and electrical interconnects. Since electrical resistance increases with the length of wires, integrating the LDD and DPM reduces waste heat relative to the individual subsystems by minimizing the length of electrical interconnects. Further, reducing the length of interconnecting wires reduces unintended inductances that can adversely affect the performance of the laser diode driver.

In order to further elucidate these teachings, exemplary embodiments are presented herein below. It should be noted that these teachings are not limited only to the exemplary embodiments.

An exemplary embodiment of the LDD 10 is shown in FIGS. 1A1, 1A2, 1B and FIGS. 2A-2C where all the electronic components are on one side of the printed circuit (PC) board 16.

The exact design of the LDD depends on the electrical operating characteristics of the fiber coupled laser diode module 50. A low SWaP LDD has been described in U.S. Pat. No. 7,792,166 B1, (2010), U.S. Pat. No. 8,170,075 (2012) and U.S. Pat. No. 6,697,402, which are incorporated by reference herein in their entirety and for all purposes. The components that generate the most waste heat to be removed are inductors and electrical switches. For illustration purposes in this disclosure, it is assumed a low SWaP LDD design that contains three low resistance inductors 40, 41, 42 and three ultra-low resistance mosfets 30, 31, 32, although other embodiments are also within the scope of these teachings. The input anode and cathode of the LDD 10 are items 1 and 2, respectively. The output anode and cathode of the LDD 10 are items 3 and 4, respectively.

The electronic components that generate the majority of the waste heat, e.g. inductors 40, 41, 42 and switches 30, 31, 32, are placed in close proximity to reduce the size and weight of the cooling system. The waste heat is transferred from the top surface of the PC board to the back surface by thermal vias 34, 35, 36, 44, 45, 46 as shown in U.S. Pat. No. 5,708,566. A thin piece of material 12 that is thermally conductive but electrically insulating, i.e diamond, SiC, AlN, is attached to each thermal via using thermally conductive adhesive 11. Electrically conductive adhesive is often used since its thermal conductivity exceeds that of electrically nonconductive adhesive. Heat spreader 14, preferably a thin sheet of copper, has an area sufficient to cover all the thin pieces of material 12. A heat sink with liquid coolant, a Microchannel cooler (MCC) 15 in the exemplary embodiment, was previously attached to heat spreader 14 by solder (not shown) in the embodiment shown.

In many instances, microchannel coolers are typically used as heatsinks for high-power laser-diode bars. Because of the low volume of usage, there are no standard microchannel coolers. For the exemplary embodiment, an SA-2 cooler heatsink manufactured by Micro Cooling Concepts was chosen for its low thermal-resistance and very-small volume. The SA-2 has the form of a hexahedron whose dimensions are 10 mm×10 mm×20 mm. The heat removal surface is 10 mm×20 mm. Additionally, the SA-2 MCC is able to remove >500 W of waste heat.

One exemplary embodiment of the microchannel cooled fiber coupled module (DPM) 50 (FIG. 3A) is the device described in U.S. Pat. No. 9,008,137, which is incorporated by reference herein in its entirety and for all purposes. The fiber optic connector is item 45. Each laser diode bar (LD-bar) (not shown) is cooled by a MCC (not shown, but see FIGS. 4-6 in U.S. Pat. No. 9,008,137). Each LD-bar/MCC subassembly (not shown) is attached to an optical plate (not shown) and a distribution structure 37 used to distribute the coolant among the LD-bar/MCC subassemblies. The coolant inlet 53 and coolant outlet 54 are attached to the distribution structure 37. The coolant inlet 44 and coolant outlet 43 (FIG. 3B) are attached to MCC 15. The coolant outlet 54 from the DPM 50 is attached via coolant conduit 38 to coolant inlet 44 of MCC 15. The length of coolant conduit 38 should be less than 10 cm.

Figures 1A, 1A:
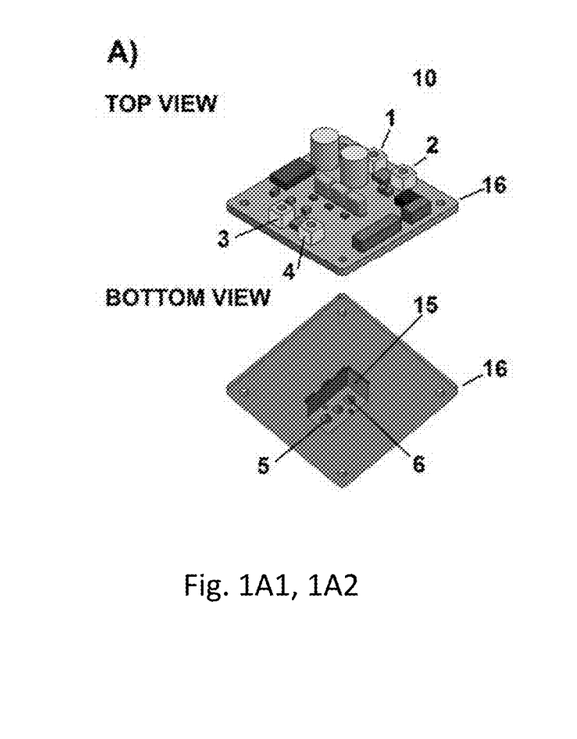
Figure 1B:
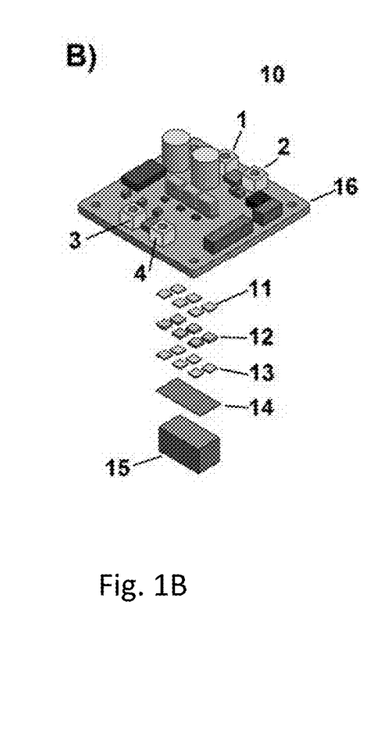
FIG. 1B show an expanded view illustrating the attachment of a microchannel cooler to a laser diode driver.
Figure 2A:
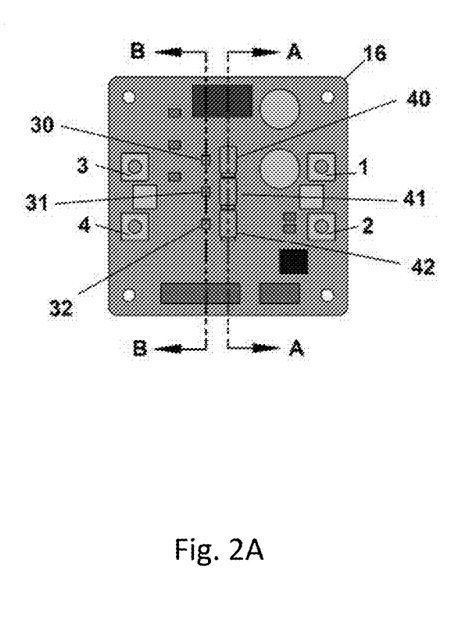
FIGS. 2A-2C show Laser diode driver and cross-sections illustrating attachment of microchannel cooler.
Figure 2B:
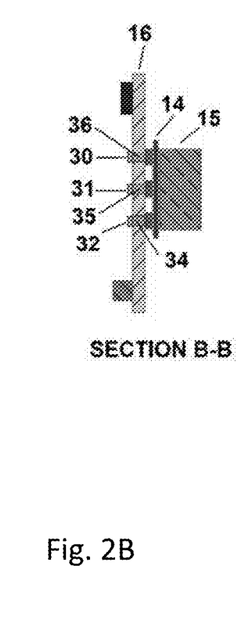
Figure 2C:
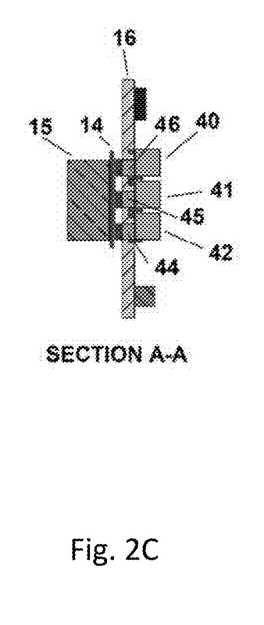
Figure 3A:
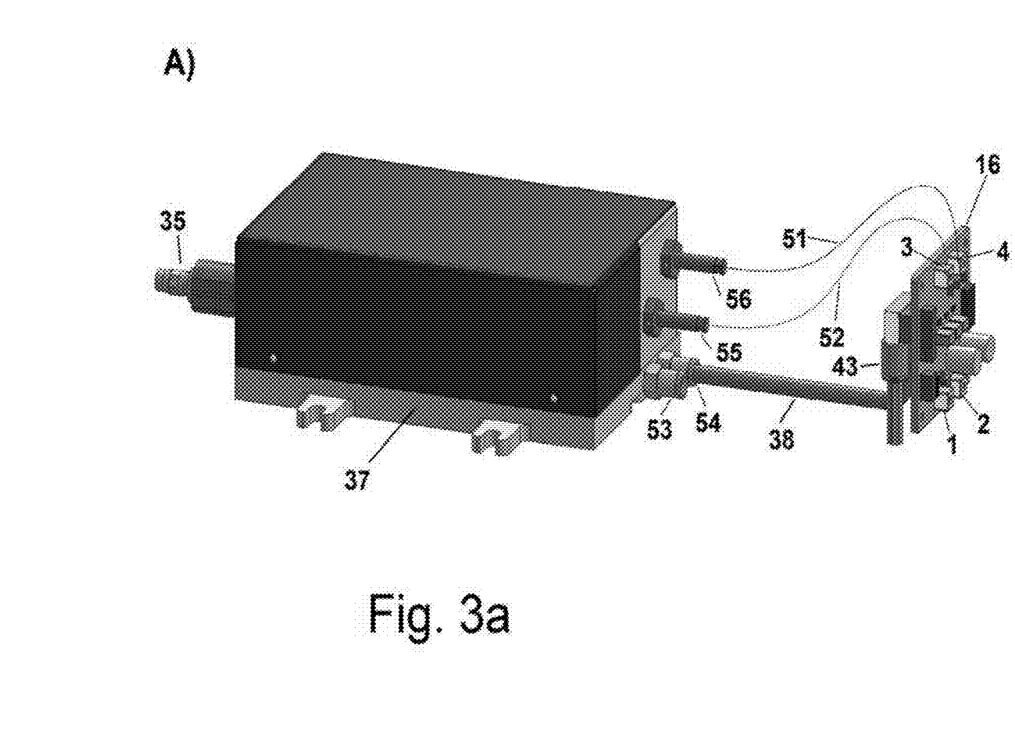
FIG. 3A is an illustration of a microchannel cooled laser diode driver integrated with a microchannel cooled fiber coupled module.
Figure 3B:
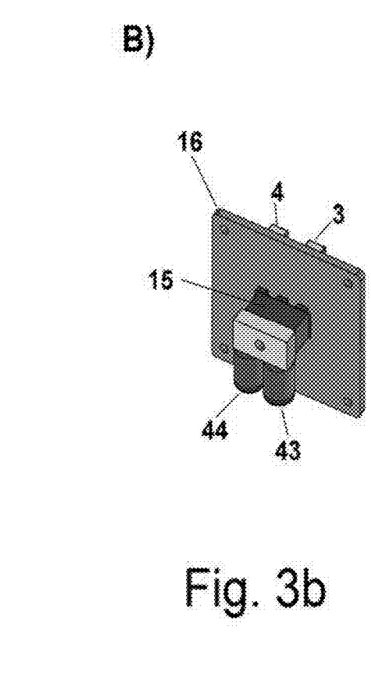
FIG. 3B represents an illustration of the back of the microchannel cooled laser diode driver.

The anode 3 and cathode 4 of the LDD 10 are connected to the anode 55 and cathode 56 of the DPM 50 by electrical conduits 52 and 51, respectively. Both the shape and length of electrical conduits 52 and 51 as well as coolant conduit 38 are adjusted for the specific application while maintaining overall low SWaP of the integrated subsystem.

FIGS. 4a-4e (FIGS. 6a-6e of U.S. Pat. No. 9,008,137) show an exemplary fiber coupled module (FCM) 80 constructed according to the teachings of U.S. Pat. No. 9,008,137. There are five LD bars mounted on their individual MCCs, 57. The optical output of each LD-bar is collimated with a Beam Transformation System (BTS) comprising a cylindrical micro-lens 85 to collimate the beam along the Fast Axis (FA) followed by an array of cylindrical micro-lenses 105 to collimate the beam along the Slow Axis. (SA) The FA and SA micro-lenses are at an angle of about 45° to each other. In contrast, in other conventional systems, the optical output of the LD bars is collimated with conventional micro-optics, consisting of a cylindrical micro-lens to collimate the beam along the fast axis (FA), followed by an array of cylindrical micro-lenses to collimate the beam along the slow axis (SA) in which the FA and SA micro-lenses are orthogonal to each other.

FIGS. 4a-4e also shows how the five individually packaged Laser Diode bars (IPLDB) and MCCs can be attached to a single Module Mounting Surface (MMS) 83. The five individually packaged Laser Diode bars are connected electrically in series to reduce the electrical current required to operate the FCM. The anode 82 and cathode 74 are the electrodes for the FCM. Cathode 74 is electrically connected to the cathode 90; anode 95 is electrically connected to cathode 91 using connector 75; anode 95 is electrically connected to cathode 91 using connector 76; anode 96 is electrically connected to cathode 92 using connector 75; anode 97 is electrically connected to cathode 93 using connector 76; anode 98 is electrically connected to cathode 94 using connector 75; anode 99 is electrically connected to anode 82. (Screw holes 67 allow electrical connection to the laser diode cathode. Screw holes 68 allow electrical connection to the laser diode anode.) Coolant can flow through channels within the Module Mounting Surface (MIMS) plate, 83, through attached tubes, or by any other convenient path. The Beam Transformation Systems are shown at 84. The Fast Axis cylindrical collimating lenses are shown at 85, and the beams initially travel upward through them.

Figure 4A:
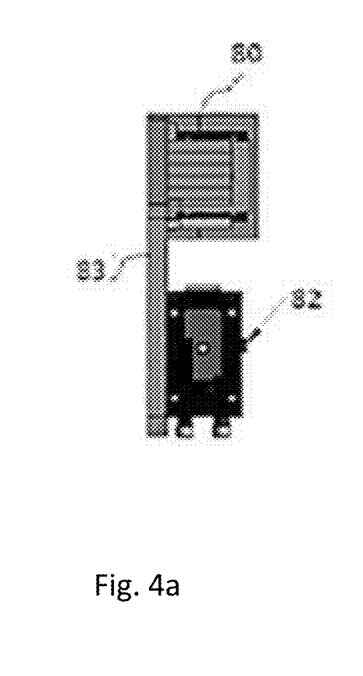
FIGS. 4a-4e show a side view of a Fiber-Coupled Module (FCM) with five Laser Diode bars attached to individual MCCs, showing the paths of the optical beams.
Figure 4B:
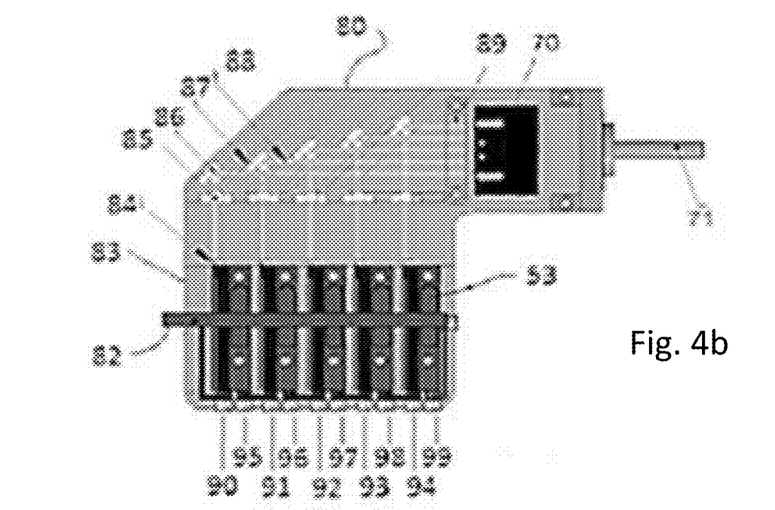
Figure 4C:
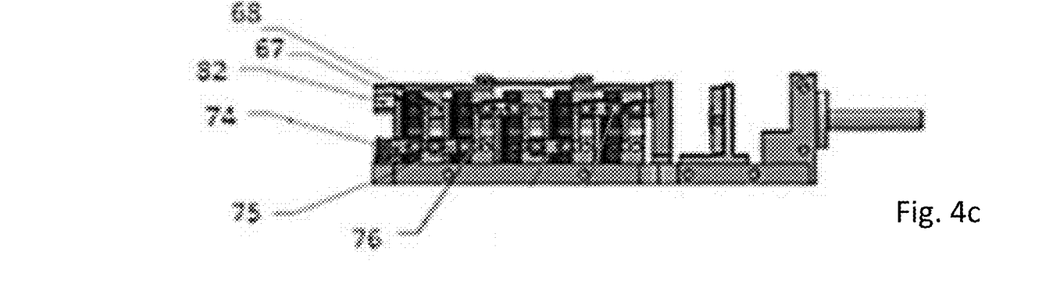
Figure 4D:
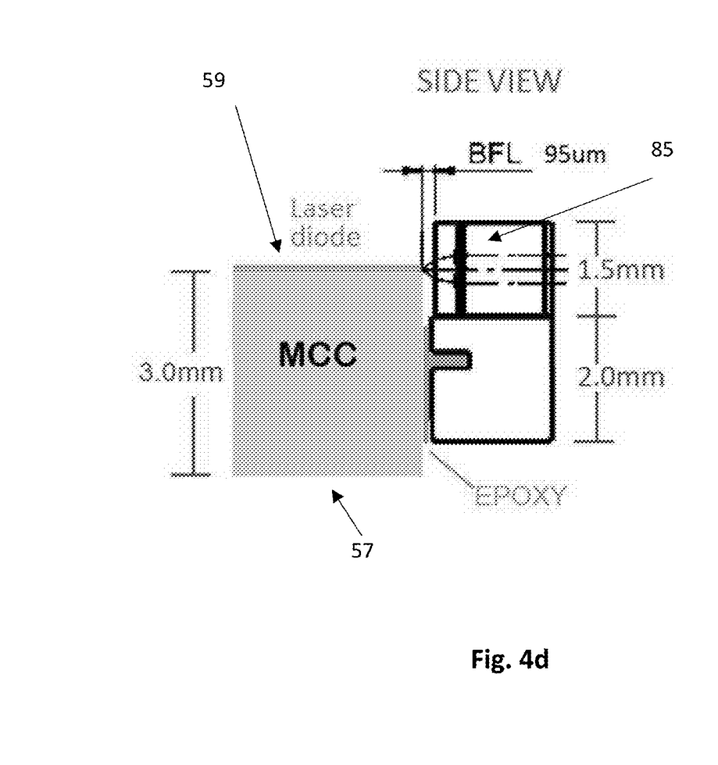
Figure 4E:
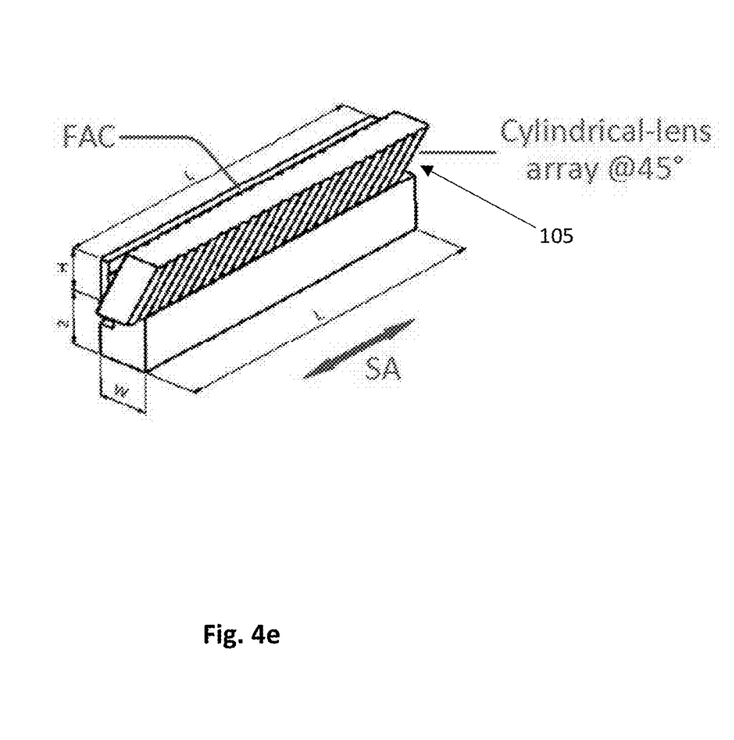

Five small Turning Mirrors, 86, attached with glass support blocks 87, redirect the individual collimated light beams, shown in white at 88, toward the right in FIG. 4e. In one embodiment, the mirrors have a substantially high reflectivity (>95%) at an emission wavelength of one or more laser diode optical sources. In one instance, the mirrors have a substantially low reflectivity (<20%) in a spectral region of 1050 nm to 1100 nm. This geometry brings the beams closer together as they pass through aperture 89. The individual beams are brought to a common focus by Aspheric Focusing Lens 70, into the SMAQ Connector 71 attached to an output optical fiber of 200μ core diameter and 0.22 Numerical Aperture (NA). The position and angular setting of each small Turning Mirror is very important, so they are preferably held and positioned one at a time while the power delivered to the optical fiber is monitored, then locked into position by UV curing of an epoxy or other polymer cement, or by use of a cooled solder attachment to the MSS plate, or by laser welding attachment to the MSS plate.

The following are incorporated by reference herein in their entirety and for all purposes:

[1] Microsystems Technology Office, Broad Area Announcement, "Efficient Ultra-Compact Laser Integrated Devices (EUCLID)", HR001117S0013, Dec. 19 (2016)

[2] T. Bradley, "Countermeasure device for a mobile tracking device" U.S. Pat. No. 8,305,252 B2, (2012)

[3] I. D. Crawford, "High-power laser diode driver" U.S. Pat. No. 6,697,402 B2, (2004)

[4] L. A. Borschowa, "Method and apparatus for driving laser diodes" U.S. Pat. No. 7,792,166 B1, (2010), U.S. Pat. No. 8,170,075 (2012)

[5] R. E. Hunninghaus, K. M. Andrews, G. L. Christopher, D. J. Anderson, and J. P. Tomase, "Solder bonded electronic module", U.S. Pat. No. 5,708,566, Jan. 13 (1998)

[6] A. K. Chin, R. H. Chin, J. Jacob, and W. T. Plummer, "Method and apparatus for compact and efficient introduction of high radiant power into an optical fiber.", U.S. Pat. No. 9,008,137 Apr. 14, (2015)

Although the invention has been described with respect to various embodiments, it should be realized these teachings are also capable of a wide variety of further and other embodiments within the spirit and scope of the appended claims.

What is claimed is:

1. A system comprising:
  a printed circuit board having components of a laser diode driver circuit, the components comprising a plurality of high-powered electronic components, surface mounted onto one surface of the printed circuit board; each one of the plurality of high-powered electronic components overlying one surface of a thermal via extending from the one surface of the printed circuit board to an opposing surface of the printed circuit board; the laser diode driver circuit having electrical connections configured to provide driving current for laser diodes;

a plurality of plates of electrically insulating and high thermal conductivity material, each one of the plurality of plates being of a predetermined thickness, said each one of the plurality of plates being disposed and sized to cover an opposing surface of the thermal via located under said each one of the plurality of high-powered electronic components;

said each one of the plurality of plates being operatively attached to the opposing surface of the printed circuit board by use of thermally conductive adhesive;

a heat spreader plate of high thermal conductivity material operatively attached to the plurality of plates by use of the thermally conductive adhesive; an area of the heat spreader plate at least covering an area of the printed circuit board on which the plurality of high-powered electronic components are mounted; and a heat removal component using liquid coolant; the heat removal component being operatively attached to the heat spreader plate by use of one of electrically conductive adhesive and solder; the heat removal component having a coolant inlet for the heat removal component and a coolant outlet for the heat removal component.

2. The system of claim 1 wherein the heat removal component is a microchannel cooler.

3. The system of claim 1 wherein the predetermined thickness is between about 200 µm and about 1000 µm.

4. The system of claim 1 wherein the electrically insulating and high thermal conductivity material is one of single crystal diamond, polycrystalline diamond, aluminum nitride, silicon carbide, beryllium oxide, and aluminum oxide.

5. The system of claim 1 wherein the heat spreader plate is a plate of copper.

6. The system of claim 1 wherein the heat removal component being operatively attached to the heat spreader plate by use of solder.

7. The system of claim 1, further comprising:

a diode laser pump module comprising:

one or more laser diode optical sources; a laser diode optical source being one of a laser diode or a laser diode bar;

one or more temperature control components, each one of the one or more temperature control components being attached to one of the one or more laser diode optical sources;

an optical system configured to optically couple electromagnetic radiation emitted from the one or more laser diode optical sources into an optical fiber; and a distribution structure having a coolant inlet for the diode laser pump module and a coolant outlet for the diode laser pump module and configured to distribute coolant to the one or more temperature control components;

the one or more laser diode optical sources being electrically operatively connected to each other in one of a series or parallel connection and being electrically connected to an anode connection for the diode laser pump module and cathode connection for the diode laser pump module;

a coolant conduit operatively connecting the coolant outlet for the diode laser pump module to the coolant inlet for data heat removal component; and the electrical connections of the laser diode driver circuit are electrically operatively connected to the anode and cathode connections for the diode laser pump module.

8. The system of claim 7 wherein a length of the coolant conduit is less than 10 cm.

* * * * *